(12) United States Patent
Kawamura

(10) Patent No.: US 9,030,518 B2
(45) Date of Patent: May 12, 2015

(54) CLOCK SIGNAL GENERATING CIRCUIT, IMAGE FORMING APPARATUS, AND CLOCK SIGNAL GENERATING METHOD OF CLOCK SIGNAL GENERATING CIRCUIT

(71) Applicant: Shintaro Kawamura, Kanagawa (JP)

(72) Inventor: Shintaro Kawamura, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/190,277

(22) Filed: Feb. 26, 2014

(65) Prior Publication Data

US 2014/0247317 A1 Sep. 4, 2014

(30) Foreign Application Priority Data

Mar. 4, 2013 (JP) ................... 2013-041618

(51) Int. Cl.
| B41J 2/435 | (2006.01) |
| H03K 3/00 | (2006.01) |
| H03K 21/02 | (2006.01) |
| H03K 5/15 | (2006.01) |

(52) U.S. Cl.
CPC .............. *H03K 21/02* (2013.01); *H03K 5/1502* (2013.01)

(58) Field of Classification Search
CPC ............... H03L 7/00; H03L 7/06; H03L 7/07; H03L 7/08; H03K 21/02
USPC ................. 347/162, 229, 234–237, 246–250; 327/114–117, 291
See application file for complete search history.

(56) References Cited

U.S. PATENT DOCUMENTS

2011/0228034 A1* 9/2011 Kyogoku ...................... 347/224

FOREIGN PATENT DOCUMENTS

| JP | 08286132 A | * 11/1996 | ............ G02B 26/10 |
| JP | 2003-140615 | 5/2003 | |
| JP | 2007-208705 | 8/2007 | |

* cited by examiner

*Primary Examiner* — Hai C Pham
(74) *Attorney, Agent, or Firm* — IPUSA, PLLC

(57) ABSTRACT

A clock signal generating circuit that generates a clock signal, the clock signal generating circuit including a clock signal generator configured to generate a reference clock signal; and a plurality of dividers to which the reference clock signal is to be input. A division ratio of at least one of the plurality of dividers varies based on division ratio data that defines the division ratio of the at least one of the plurality of dividers. The division ratio data represents a value that fluctuates around reference division ratio data with respect to time.

5 Claims, 14 Drawing Sheets

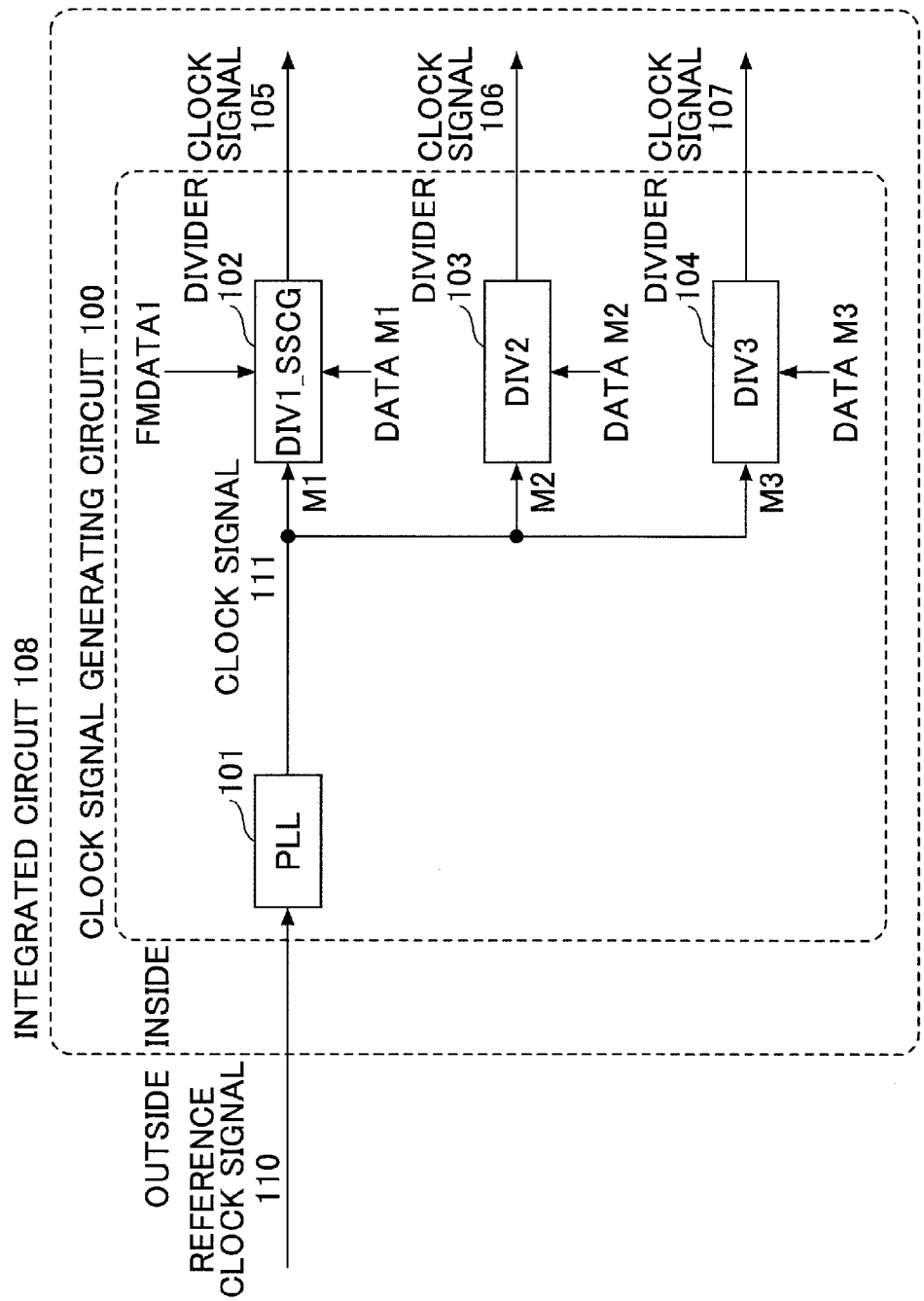

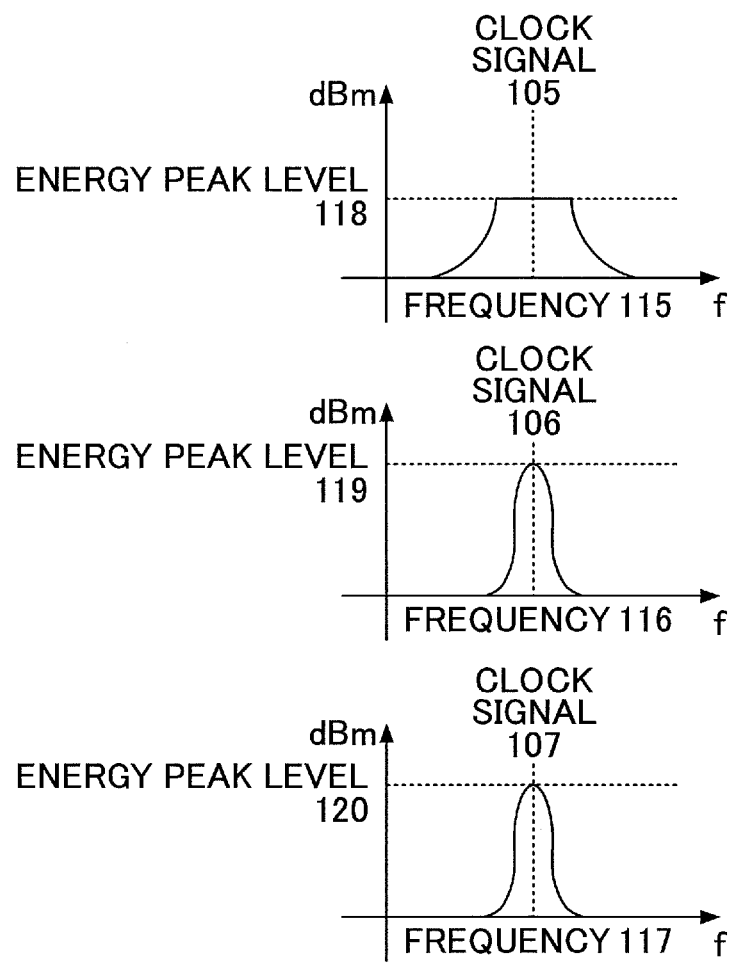

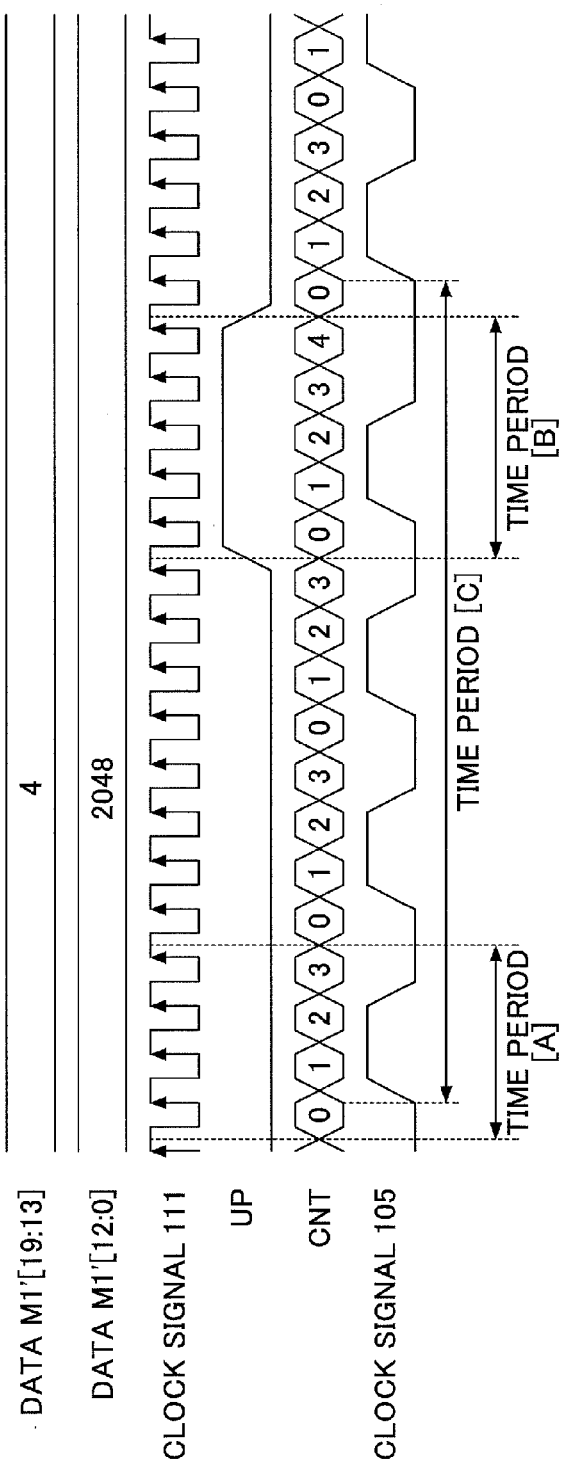
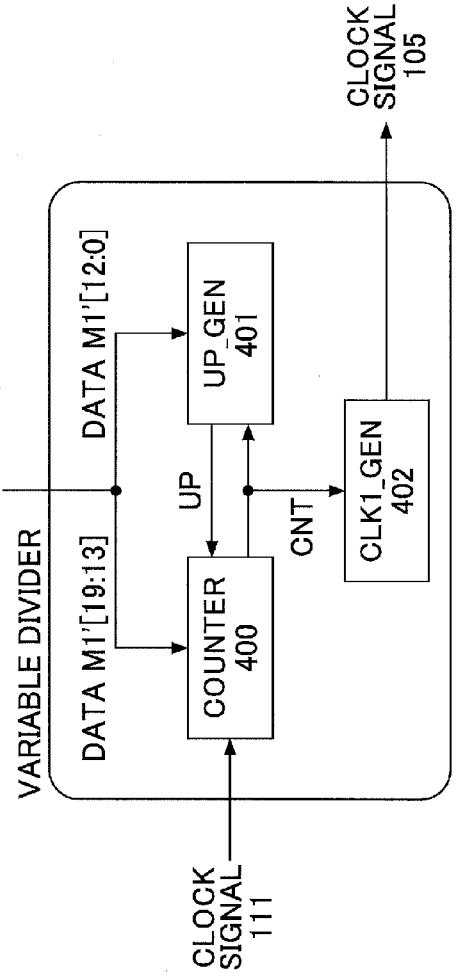
FIG.4A
FIG.4B

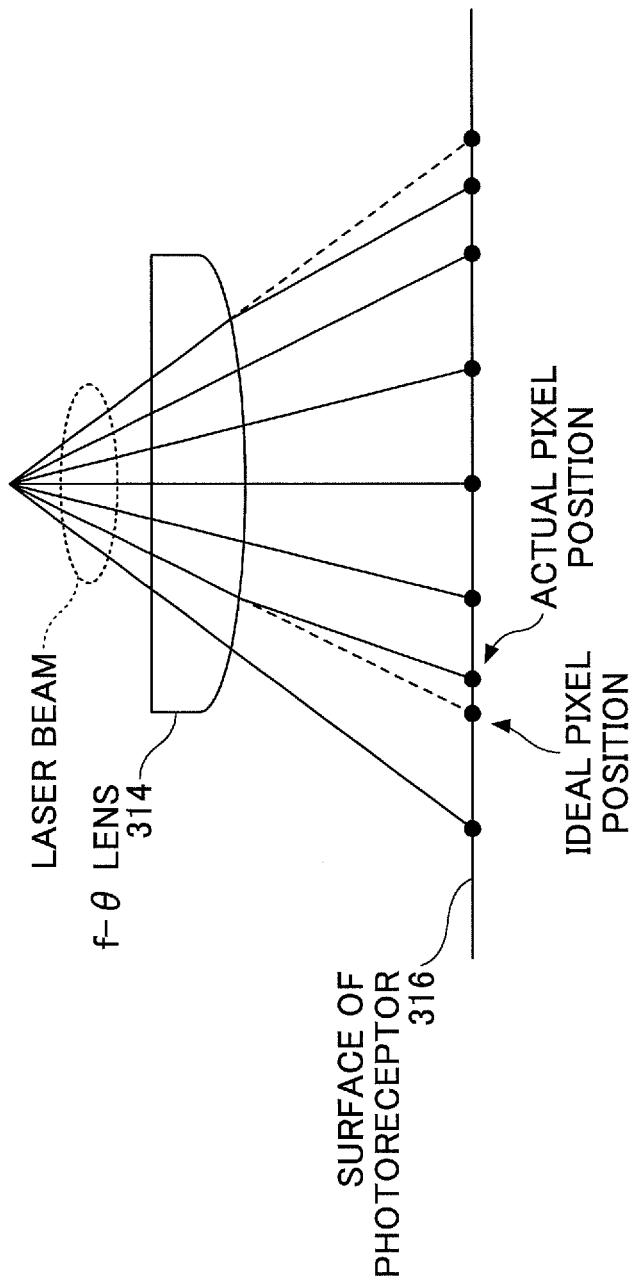

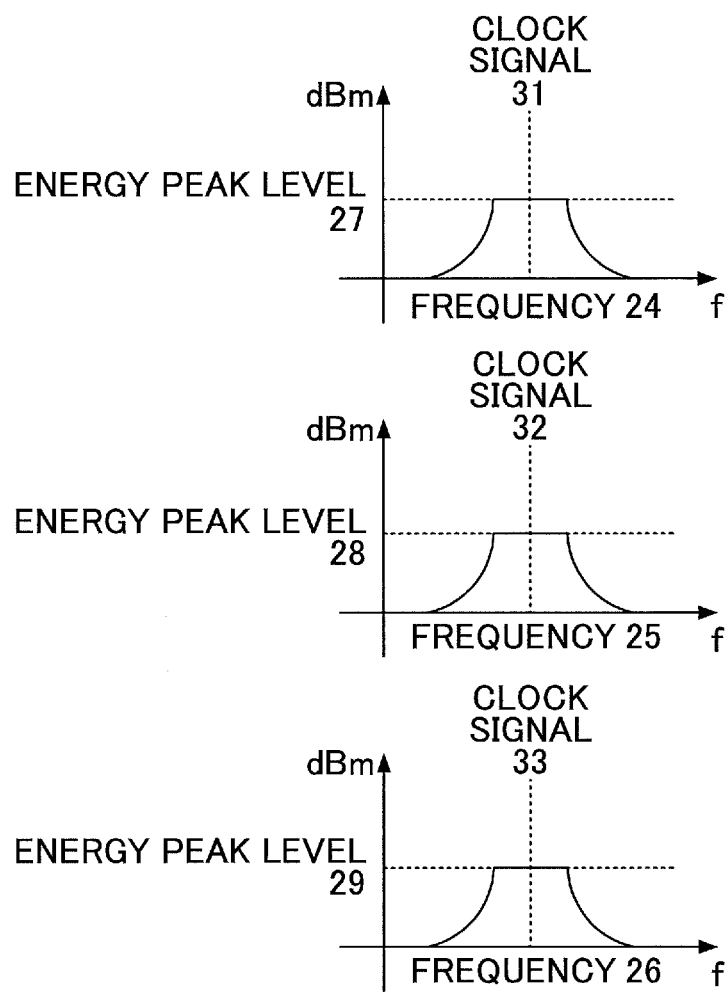

CLOCK SIGNAL GENERATING CIRCUIT, IMAGE FORMING APPARATUS, AND CLOCK SIGNAL GENERATING METHOD OF CLOCK SIGNAL GENERATING CIRCUIT

BACKGROUND OF THE INVENTION

1. Field of the Invention

The present invention relates to a clock signal generating circuit, an image forming apparatus, and a clock signal generating method of the clock signal generating circuit.

2. Description of the Related Art

In general, an electronic device generates and emits electromagnetic waves. Such an electronic device may affect operation of another device by such electromagnetic waves, unless a suitable method is implemented for preventing generation and/or emission of electromagnetic waves. Such disruption of operation of an electronic device caused by undesired emission of electromagnetic waves may be referred to as electromagnetic interference (EMI). EMI can be an external factor that may cause, for example, deterioration of a function, a malfunction, an interruption, or loss of data in an electronic device.

Many countries have adopted some regulations and/or standards on electromagnetic radiation so as to prevent EMI. In a country that has adopted an EMI regulation, selling and/or using a device that does not comply with the regulation may be prohibited.

In general, when a clock generator in an electronic device oscillates in a single frequency, energy of a clock signal may be increased. A technique for spreading energy has been known such that a frequency of a clock signal is slightly modulated (i.e., frequency modulation), and thereby a peak level of the energy of the clock signal may be reduced to be a lower level. Such a technique may be referred to as "spread spectrum." A generator for which this technique is adopted may be referred to as a "spread spectrum clock generator" (which is referred to as "SSCG," hereinafter). A SSCG may be a component that complies with an EMI regulation.

Patent Document 1 (Japanese Unexamined Patent Publication No. 2003-140615) discloses a spread spectrum clock signal generating circuit.

SUMMARY OF THE INVENTION

According to an aspect of the present invention, there is provided a clock signal generating circuit configured to generate a clock signal, the clock signal generating circuit including a clock signal generator configured to generate a reference clock signal; and a plurality of dividers to which the reference clock signal is to be input, wherein a division ratio of at least one of the plurality of dividers varies based on division ratio data that defines the division ratio of the at least one of the plurality of dividers, and wherein the division ratio data represents a value that fluctuates around reference division ratio data with respect to time.

According to another aspect of the present invention, there is provided an image forming apparatus including a clock signal generating circuit configured to generate a clock signal, and an image processing circuit configured to operate by the clock signal generated by the clock signal generating circuit. The clock signal generating circuit includes a clock signal generator configured to generate a reference clock signal; and a plurality of dividers to which the reference clock signal is to be input. A division ratio of at least one of the plurality of dividers varies based on division ratio data that defines the division ratio of the at least one of the plurality of dividers, and the division ratio data represents a value that fluctuates around reference division ratio data with respect to time.

According to another aspect of the present invention, there is provided a clock signal generating method of a clock signal generating circuit including a clock signal generator and a plurality of dividers, the clock signal generating method including a step of generating a reference clock signal; a step of inputting the reference clock signal to the plurality of dividers; a step of generating division ratio data that defines division ratios of the corresponding dividers; and a step of dividing the reference clock signal by each of the division ratios based on the division ratio data, wherein the division ratio data represents a value that fluctuates around reference division ratio data with respect to time.

Other objects, features and advantages of the present invention will become more apparent from the following detailed description when read in conjunction with the accompanying drawings.

BRIEF DESCRIPTION OF THE DRAWINGS

FIG. 1A is a diagram showing an example of a clock signal generating circuit;

FIG. 1B is a diagram showing an example of relationship between a frequency and a energy peak level;

FIG. 4A is a diagram illustrating an example of a frequency division method;

FIG. 4B is a diagram showing a functional configuration of an example of a variable divider;

FIGS. 8A and 8B are diagrams showing an example of an image forming apparatus;

FIG. 11B is a diagram showing another example of relationship between a frequency and an energy peak level.

DETAILED DESCRIPTION OF THE PREFERRED EMBODIMENTS

Spread spectrum may be used for reducing EMI. Such spread spectrum is explained by referring to FIGS. 10A-10D.

Figure 10A:
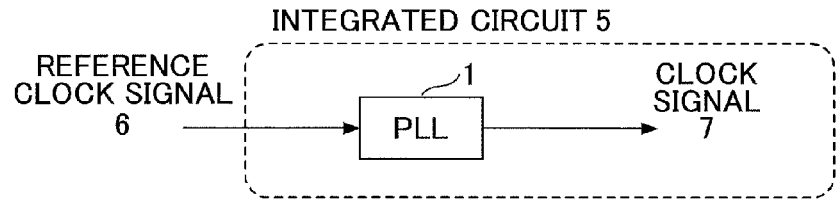
FIGS. 10A-10D are diagrams illustrating an example of spread spectrum.

FIG. 10A shows that a reference clock 6 is input to a phase locked loop 1 (which is referred to as the "PLL 1," hereinafter) that is included in an integrated circuit 5, and that the PLL 1 outputs a clock signal 7.

Figure 10B:
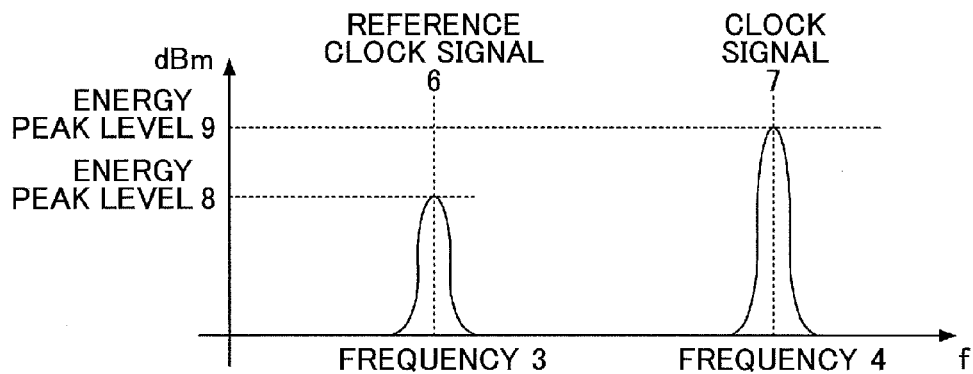

FIG. 10B shows an energy peak level 8 of a reference clock signal 6 having a single frequency 3. Additionally, FIG. 10B shows an energy peak level 9 of a clock signal 7 having a single frequency 4. In this specification, a single frequency may not always mean that the frequency takes only one value. A single frequency may also mean that there is only one frequency (i.e., one value) at which the energy level of the clock signal is at a maximum. Accordingly, the single frequency may include a case in which a frequency is fluctuated.

Figure 10C:
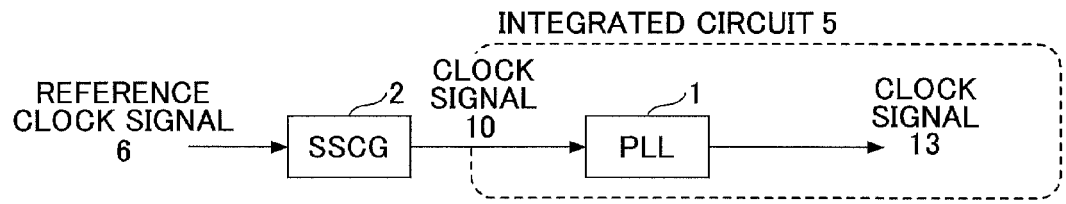

FIG. 10C shows that the reference clock signal 6 is input to a SSCG 2 that is disposed outside the integrated circuit 5. After the reference clock signal 6 is input to the SSCG 2, a clock signal 10 is input to the PLL 1. The SSCG 2 generates the clock signal 10 by frequency modulating the reference clock signal 6. When the clock signal 10 is input to the PLL 1, the PLL 1 outputs a clock signal 13.

Figure 10D:
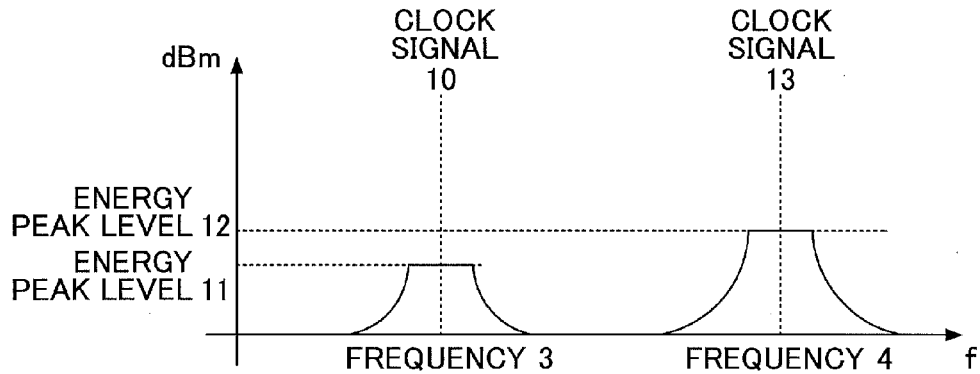

FIG. 10D shows an energy peak level 11 of the clock signal 10 whose frequency is modulated. FIG. 10D also shows an energy peak level 12 of the clock signal 13 whose frequency is modulated.

By FIGS. 10A-10D, it can be seen that a clock signal that passes through a SSCG and to which spread spectrum modulation is applied may have a smaller energy peak level, and that the energy peak level has a width (in this specification, "an energy peak level has a width" may mean that the energy peak level corresponds to a certain frequency range, instead of a single frequency value), compared to a clock signal that does not pass through the SSCG and that has a single frequency. In other words, it can be understood from FIGS. 10A-10D that the SSCG is effective for reducing an energy peak level of a clock signal, so that an electronic device may comply with an EMI regulation.

To prevent EMI from occurring, in the spread spectrum clock signal generating circuit according to Patent Document 1, frequency modulation data is prepared for a variable divider in a PLL. Based on frequency division number data that is obtained by adding the frequency modulation data and reference division number data, the spread spectrum clock signal generating circuit outputs a frequency modulated clock signal.

To prevent EMI from occurring, a clock signal whose energy peak level is reduced may preferably be utilized within an integrated circuit. In a spread spectrum clock signal generating circuit according to a comparative example, prior to a clock signal entering the integrated circuit, spread spectrum modulation is applied to the clock signal that passes through the SSCG disposed at an input side of the PLL. Such a clock signal is used inside the integrated circuit.

However, in this case, the spread spectrum modulation is also applied to a clock signal for which an EMI countermeasure may not be required. Then, the spread spectrum clock signal is input to the integrated circuit.

Figure 11A:
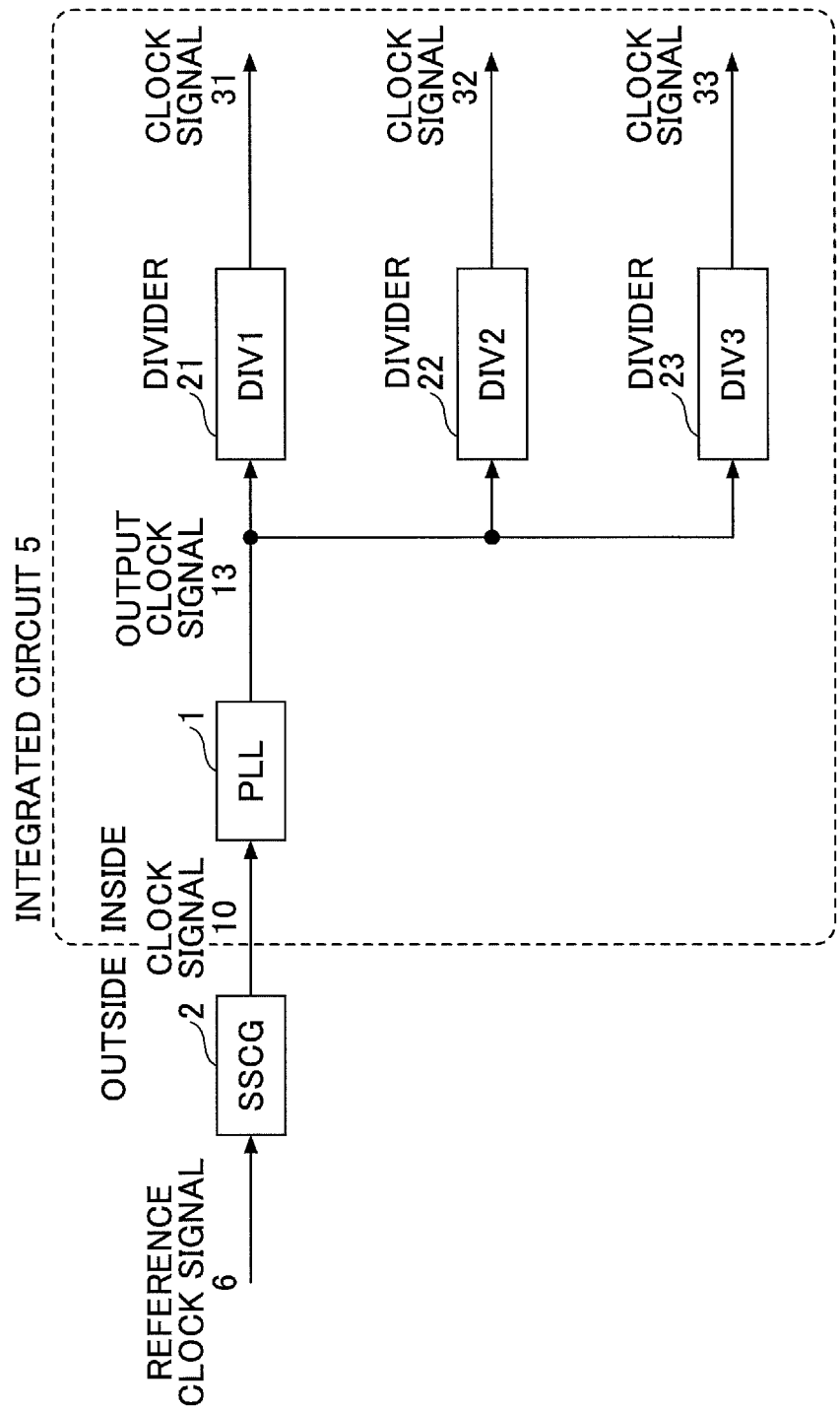
FIG. 11A is a diagram illustrating a clock signal generating circuit according to a comparative example.

For example, as shown in FIG. 11A, a spread spectrum clock signal 13 is input to dividers 21, 22, and 23. Then frequency modulation is applied to the clock signals that enter the dividers 21, 22, and 23, respectively, regardless of whether an EMI countermeasure may be required or not.

As depicted in FIG. 11B, frequency modulation is applied to a clock signal 31 while maintaining a center frequency to be a frequency 24. An energy peak level 27 is achieved for a frequency range having a certain width. Similarly, frequency modulation is applied to clock signals 32 and 33 while maintaining corresponding center frequencies to be frequencies 25 and 26. Energy peak levels 28 and 29 are achieved for corresponding frequency ranges having certain widths.

Spread spectrum may be applied to a clock signal for which an EMI countermeasure may not be required. Consequently, a plurality of buffers may be required to absorb a deviation with respect to the center frequency, and/or to absorb a phase deviation. Moreover, for a digital circuit, requirements on timing accuracy may be strict.

Accordingly, for such a clock signal generating circuit described above, production requirements may increase, and the circuit may be complicated. Consequently, cost for designing the clock generating circuit may increase.

Patent Document 1 does not disclose any way to reduce such cost for designing the clock signal generating circuit.

An embodiment of the present invention has been developed in view of the above-described circumstances. There is a need for reducing cost for designing a clock signal generating circuit that can reduce effect of EMI.

According to the embodiment of the present invention, cost can be reduced for designing a clock signal generating circuit that can reduce effect of EMI.

(Example of a Configuration of a Clock Signal Generating Circuit)

FIG. 1 is a schematic configuration diagram of an example of a clock signal generating circuit according to an embodiment.

A clock signal generating circuit 100 includes a phase-locked loop (PLL) 101 that is a clock signal generator; and a plurality of dividers including a divider 102 for executing spread spectrum modulation, a divider 103 for not executing the spread spectrum modulation, and a divider 104 for not executing the spread spectrum modulation.

The clock signal generating circuit 100 may include one divider for executing spread spectrum modulation, and two dividers for not executing spread spectrum modulation. However, these numerical values are for exemplifying purpose only. The number of the dividers that execute spread spectrum modulation, and the number of the dividers for not executing spread spectrum modulation are not particularly limited.

As shown in FIG. 1A, a reference clock signal 110 transmitted from outside an integrated circuit 108 is input to the PLL 101 included in the clock signal generating circuit 100.

The PLL 101 functions as a multiplier. For example, when a division ratio is N, the PLL 101 outputs a clock signal 111 having a frequency 112 that is obtained by multiplying a frequency 109 of the reference clock signal 110 by N.

The clock signal 111 output from the PLL 101 is input to the divider 102 for executing the spread spectrum modulation; to the divider 103 for not executing the spread spectrum modulation; and to the divider 104 for not executing the spread spectrum modulation.

The divider 102 for executing the spread spectrum modulation divides the frequency of the input clock signal 111 by a division ratio M1' (which is determined based on a reference division ratio M1 and frequency modulation data, which is described later), and the divider 102 outputs a clock signal 105. The divider 103 for not executing the spread spectrum modulation divides the frequency of the input clock signal 111 by a reference division ratio M2, and the divider 103 outputs a clock signal 106. The divider 104 for not executing the spread spectrum modulation divides the frequency of the input clock signal 111 by a reference division ratio M3, and the divider 103 outputs a clock signal 107.

In the clock signal generating circuit 100, prior to the clock signal 111 entering the dividers 102, 103, and 104, the spread spectrum modulation is not applied to the clock signal 111.

A reference division ratio of the divider 102 for executing the spread spectrum modulation is defined to be M1. The reference division ratio of the divider 103 for not executing the spread spectrum modulation is defined to be M2. The reference division ratio of the divider 104 for not executing the spread spectrum modulation is defined to be M3.

(Operation of the Clock Signal Generating Circuit)

Reference division ratio data DATA M1 and the frequency modulation data FMDATA1 (which is described later) are input to the divider 102. The divider 102 divides the frequency of the input clock signal 111 by the division ratio M1' defined by division ratio data DATA M1' including the reference division ratio data DATA M1 and the frequency modulation data FMDATA1, and the divider 102 outputs the clock signal 105.

The frequency modulation data FMDATA1 that is input to the divider 102 (for executing the spread spectrum modulation) fluctuates in the vicinity of zero. Accordingly, the division ratio data DATA M1' that is obtained by adding the reference division ratio data DATA M1 and the frequency modulation data FMDATA1 fluctuates in the vicinity of the reference division ratio data DATA M1. The division ratio M1' varies with respect to time.

The reference division ratio data DATA M2 is input to the divider 103 for not executing the spread spectrum modulation. The divider 103 for not executing the spread spectrum modulation divides the frequency of the input clock signal 111 by the reference division ratio M2 that is based on the reference division ratio data DATA M2, and the divider 103 outputs the clock signal 106.

The reference division ratio data DATA M3 is input to the divider 104 for not executing the spread spectrum modulation. The divider 104 for not executing the spread spectrum modulation divides the frequency of the input clock signal 111 by the reference division ratio M3 that is based on the reference division ratio data DATA M3, and the divider 104 outputs the clock signal 107.

(Frequency Modulation by the Clock Signal Generating Circuit)

FIG. 1B is a diagram showing a relationship between a frequency and an energy peak level. In FIG. 1B, the horizontal axis indicates a frequency, and the vertical axis indicates an energy level.

From FIG. 1B, it can be seen that the frequency of the clock signal 105 that is output from the divider 102 (for executing the spread spectrum modulation) is modulated, and that a range of frequency in which the energy level of the frequency modulated clock signal 105 reaches the energy peak level 118 has a certain width.

As described below in detail, the division ratio M1' of the divider 102 for executing the spread spectrum modulation varies depending on time. The division ratio M1' can be used to modulate the frequency of the clock signal 105 with respect to time.

An average value of the frequency modulation data FMDATA1 with respect to time is zero. Accordingly, the frequency of the clock signal 105 is modulated in the vicinity of a frequency 115 of a clock signal that is obtained by dividing the frequency 112 of the clock signal 111 by the reference division ratio M1. The frequency of the clock signal 105 is obtained by dividing the frequency 112 by the division ratio M1'. Consequently, the frequency of the clock signal 105 is modulated in accordance with the fluctuation of the division ratio M1'.

Additionally, from FIG. 1B, it can be seen that the clock signal 106 output from the divider 103 for not executing the spread spectrum modulation has a single frequency, and that the clock signal 107 output from the divider 104 for not executing the spread spectrum modulation has a single frequency.

Namely, the frequency modulation data may be input only to a divider that outputs a clock signal for which an EMI countermeasure may be required. Then, by varying the division ratio data with respect to time, the frequency of the clock signal can be modulated, and the modulated clock signal can be output. Additionally, for a clock signal for which an EMI countermeasure may not be required, the frequency may not be modulated, and the resultant clock signal may be output.

By applying a spread spectrum modulation only to a clock signal for which an EMI countermeasure may be required, a number of buffers may be reduced which are for absorbing a deviation with respect to the center frequency and/or a phase deviation. In addition, requirements on timing accuracy for a digital circuit may be mitigated. Consequently, complication of circuits in the clock signal generating circuit 100 can be avoided, and production requirements on the clock signal generating circuit 100 may be mitigated.

In the clock signal generating circuit 100 according to the embodiment, the frequency modulation can only be applied to a clock signal for which an EMI countermeasure may be required. Here, the clock signal is used inside the integrated circuit 108. Accordingly, cost can be reduced for designing the clock signal generating circuit that can reduce effect of EMI.

(Configuration of Divider for Executing a Spread Spectrum Modulation)

Figure 2:
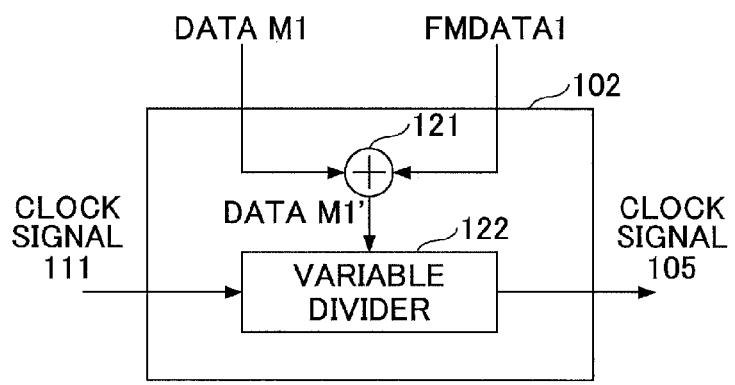
FIG. 2 is a diagram showing an example of a divider.

FIG. 2 is a schematic configuration diagram of an example of the divider 102 for executing the spread spectrum modulation.

The divider 102 for executing the spread spectrum modulation includes an adder 121; and a variable divider 122.

When the reference division ratio data DATA M1 and the frequency modulation data FMDATA1 are input to the adder 121, the adder 121 adds the reference division ratio data DATA M1 and the frequency modulation data FMDATA1, and the adder 121 outputs the division ratio data DATA M1', which is a result of the addition.

The division ratio data DATA M1' is input to the variable divider 122. The variable divider 122 divides the frequency 112 of the clock signal 111 by the division ratio M1' defined by the division ratio data DATA M1', and the variable divider 122 outputs a resultant signal as the clock signal 105.

(Specific Function of the Adder)

Figure 3:
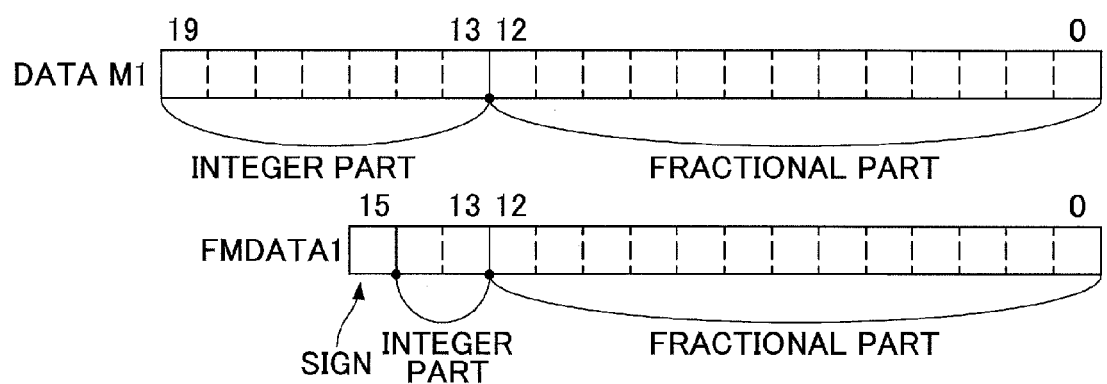
FIG. 3 is a diagram illustrating an example of a specific function of an example of an adder.

FIG. 3 is a diagram illustrating an example of a specific function of the adder 121.

As shown in FIG. 3, the reference division ratio data DATA M1 is defined to be a digital data of 20 bits. DATA M1 [19:13] represents an integer part of the reference division ratio data DATA M1. DATA M1 [12:0] represents a fractional part of the reference divisional ratio data DATA M1.

As shown in FIG. 3, the frequency modulation data FMDATA1 is defined to be digital data of 15 bits with a sign (i.e., two's-complement representation). FMDATA1 [15] represents a sign of the frequency modulation data FMDATA1. FMDATA1 [14:13] represents an integer part of the frequency modulation data FMDATA1. FMDATA1 [12:0] represents a fractional part of the frequency modulation data FMDATA1.

The adder 121 prepares four bits, and pads each of the four bits with the value of FMDATA1 [15]. The adder 121 places the resultant four bits in front of the most significant bit of the frequency modulation data FMDATA1 of 16 bits. In this manner, the adder 121 generates digital data of 20 bits with a sign (i.e., two's-complement representation). Then, the adder 121 adds the reference division ratio data DATA M1, which is the digital data of 20 bits, and the generated digital data of 20 bits with a sign, and the adder 121 obtains the division ratio data DATA M1', which is digital data of 20 bits.

For example, suppose that DATA M1 [19:0]="00001100100010111000." The integer part of DATA M1 (i.e., DATA [19:13], which is seven bits from the most significant bit) is separated from the fractional part of DATA M1 (i.e., the remaining thirteen bits). The integer part of the reference division ratio data DATA M1 is DATA M1 [19:13]="0000110"=6. The fractional part of the reference division ratio data DATA M1 is DATA M1 [12:0]="0100010111000"=2232. Accordingly, the integer part is 6, and the fractional part is 2232.

The fractional part of the reference division ratio has a resolution of 1/8192. In this case, the fractional part of the reference division ratio is DATA M1 [12:0]/8192=2232/8192=0.272.

As described above, the fractional part of the reference division ratio is calculated by multiplying the fractional part of the reference division ratio data DATA M1 by the resolution of the fractional part of the reference division ratio. In this example, the resolution of the fractional part of the reference division ratio is 1/8192. Accordingly, the fractional part of the reference division ratio can be calculated by the formula:

DATA M1 [12:0 ]/8192.

For the case where DATA M1 [19:0]="00001100100010111000", the integer part of the reference division ratio is 6, and the fractional part of the reference division ratio is 0.272 (i.e., 2232/8192). Namely, for the case where DATA M1 [19:0]="00001100100010111000," the reference division ratio M1 is 6+0.272=6.272.

In this case, the frequency modulation data FMDATA1 can be varied within a range from −{3+(8192/8192)} to +{3+(8191/8192)}. That is because the sign can be "+" or "−," the integer part of the frequency modulation data FMDATA1 can be less than or equal to 3, and the fractional part of the frequency modulation data FMDATA1 can be less than or equal to 8191/8192. Next, a specific addition method by using the adder 121 is explained. The adder 121 prepares four bits, and pads each of the four bits with the value of FMDATA1 [15]. The adder 121 places the resultant four bits in front of FMDATA1 [15:0], and the adder 121 generates the digital data of 20 bits with a sign. Then, the adder 121 adds the generated digital data and the reference division ratio data DATA M1. That is because, the frequency modulation data FMDATA1 is the digital data of 16 bits, and the reference division ratio data DATA M1 is the digital data of 20 bits. For example, suppose that FMDATA1 [15:0]="1011111101001000" (=−2.8008). Since FMDATA1 [15]="1," the four bits data "1111" is placed in front of FMDATA1 [15:0]="1011111101001000," and the resultant digital data "11111011111101001000" is added to DATA M1 [19:0]="00001100100010111000."

By this addition, the following results are obtained:

DATA M1' [19:13]=4, and

DATA M1' [12:0]=2048.

Namely, the integer part of the division ratio data DATA M1' is 4, and the fractional part of the division ratio data DATA M1' is 2048.

Accordingly, when DATA M1 [19:0]="00001100100010111000" and FMDATA1 [15:0]="1011111101001000" are added, the integer part of the division ratio is 4, and the fractional part of the division ratio is DATA M1' [12:0]/8192=2048/8192=0.25. Namely, the division ratio M1' based on the result of adding DATA M1 [19:0]="00001100100010111000" and FMDATA1 [15:0]="1011111101001000" is 4+0.25=4.25.

The divider 102 for executing the spread spectrum modulation can divide the frequency 112 of the clock 111 by this division ratio M1'=4.25, for example.

With the above-described addition method, the frequency modulation data FMDATA1 may represent a positive value or a negative value. Consequently, the frequency of the clock signal 105 can be modulated in a positive direction and in a negative direction. Additionally, both the integer part and the fractional part of the frequency modulation data FMDATA1 can be adjusted. Thus, the resolution of the frequency modulation can be enhanced.

(Frequency Division Method of the Variable divider)

FIG. 4A is a diagram illustrating an example of a frequency division method of the variable divider 122. FIG. 4B is a diagram showing a functional configuration of an example of the variable divider 122. Hereinafter, the example of the frequency division method of the variable divider 122 is explained by referring to FIGS. 4A and 4B.

A case is explained where DATA M1' [19:13]=4, and DATA M1' [12:0]=2048, which are the same as the case of FIG. 3. In this case, the division ratio M1' of the variable divider 122 is 4.25.

As shown in FIG. 4B, the variable divider 122 may include a counter 400; an up_gen 401 that is an up signal generator; and a clk1_gen 402 that is a clock signal generator.

DATA M1' [19:0] is input to the variable divider 122. Then, the DATA M1' [19:0] is divided into the integer part DATA M1' [19:13] and the fractional part DATA M1' [12:0]. DATA M1' [19:13] is input to the counter 400. DATA M1' [12:0] is input to the up_gen 401.

The clock signal 111 is input to the counter 400.

The counter 400 generates a count value CNT that is obtained by counting the clock signal 111 based on the DATA M1' [19:13]. The counter 400 inputs the count value CNT to the up_gen 401 and to the clk_gen 402.

The up_gen 401 outputs an UP signal based on DATA M1' [12:0] and the count value CNT.

The clk1_gen 402 generates the clock signal 105 based on the count value CNT, and the clk1_gen 402 outputs the clock signal 105.

As shown in FIG. 4A, the counter value CNT returns to zero, after the count value becomes three (i.e., CNT=DATA M1' [19:13] −1=4 −1=3). In other words, this example is the case where DATA M1' [19:13]=4. Accordingly, the counter value CNT repeats sequentially taking the numerical values of zero, one, two, and three.

The up_gen 401 generates the UP signal 2048 times (=DATA M1' [12:0]) during 8192 cycles. Here, one cycle corresponds a time period between previous and succeeding moments at which the counter value CNT becomes zero.

As shown in FIG. 4A, one UP signal is generated per 4 (=8192/2048) cycles.

Further, as shown in FIG. 4A, the clock signal 105 is asserted when CNT=0. The clock signal 105 is negated when CNT=DATA M1' [19:13]/2 (=4/2=2).

During the time period in which the UP signal is negated, the count value CNT returns to zero after the count value CNT becomes three (e.g., the time period [A] in FIG. 4A). However, during the time period in which the UP signal is asserted, a time period between previous and succeeding moments at which the count value CNT becomes zero is increased by a time period corresponding to one count. Namely, during the time period in which the UP signal is asserted, the count value CNT is incremented from zero to four, and after that the counter value CNT returns to zero. Namely, the count value CNT returns to zero, after the count value becomes CNT=DATA M1' [19:13]=4 (cf., the time period [B] of FIG.

4A). Consequently, during the time period in which the UP signal is asserted, the period of the clock signal 105 is increased by a time period corresponding to one period of the clock signal 111.

The clk_gen 402 generates a clock signal 105 having a value of H at a moment at which the count value CNT=1, and at a moment at which the count value CNT=2. The clk_gen 402 generates the clock signal 105 having a value of L at a moment at which the count value CNT=0, at a moment at which the count value CNT=3, and at a moment at which the count value CNT=4.

As shown in FIG. 4A, in the time period [C], one UP signal is generated per four cycles. Accordingly, in the time period [C], the division ratios are 4, 4, 4, and 5. In the clock signal 105, the pattern of the time period [C] is repeated. Thus, an average division ratio is 4.25={(4+4+4+5)/4}. In other words, the variable divider 122 divides the frequency 122 of the clock signal 111 by the division ratio of 4.25, and the variable divider 122 outputs the clock signal 105. In this manner, with the variable divider 122, the fractional part of the division ratio M1' can be adjusted.

(Frequency Modulation Method)

Hereinafter, an example of the frequency modulation method is explained by referring to FIG. 5. The frequency modulation method is based on the frequency modulation data FMDATA1.

For the divider 102 for executing the spread spectrum modulation, the reference division ratio is M1, and the division ratio is M1'. The frequency of the clock signal 105 is a value that is obtained by dividing the frequency 112 of the clock signal 111 by the division ratio M1' (which varies depending on time). The center frequency of the clock signal 105 is a value that is obtained by dividing the frequency 112 of the clock signal 111 by the reference division ratio M1 (i.e., the frequency 115).

Figure 5:
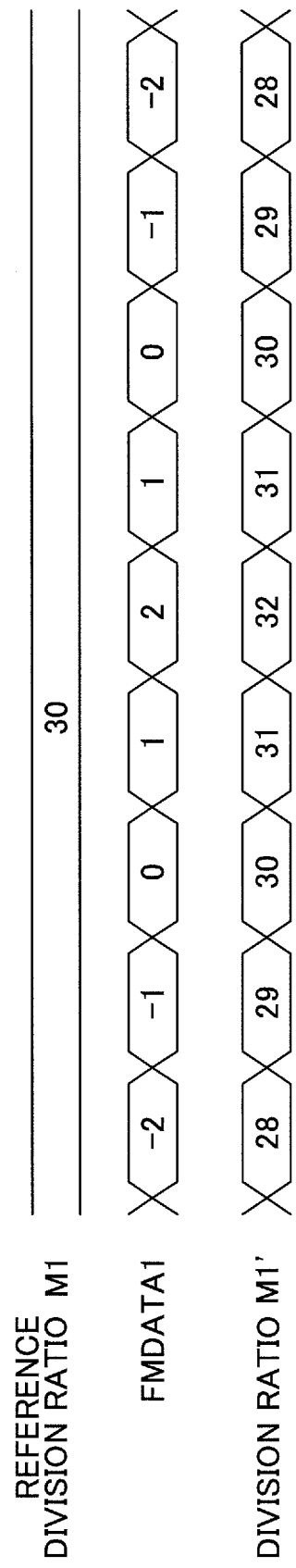
FIG. 5 is a diagram illustrating an example of a frequency modulation method.

As shown in FIG. 5, the frequency modulation data FMDATA1 varies with respect to time. Accordingly, the division ratio M1' varies with respect to time. For example, when the reference division ratio M1 is 30, and when the frequency modulation data FMDATA1 is varied in a range from −2 to +2, the division ratio M1' varies in a range from +28 to +32.

When the division ratio M1' fluctuates, the frequency of the clock signal 105 is modulated. When the spread spectrum modulation is applied to the clock signal 105, the frequency of the clock signal 105 is modulated around the frequency 115 (i.e., (the frequency 112)/30) in a frequency range from (the frequency 112)/32 to (the frequency 112)/28.

The average value of the frequency modulation data FMDATA1 with respect to time can be adjusted to be zero because the frequency modulation data FMDATA1 can represent both a positive value and a negative value. By adjusting the average value of the frequency modulation data FMDATA1 to be zero, the frequency of the clock signal 105 can be modulated around the frequency calculated by (the frequency 112)/(the division ratio M1).

Further, as described above, for the reference division ratio data DATA M1 and the frequency modulation data FMDATA1, the fractional part can be adjusted. The fractional part of the division ratio data DATA M1' can be adjusted based on the fractional parts of the reference division ratio data DATA M1 and the frequency modulation data FMDATA1. Thus, the division ratio data DATA M1' can be expressed by N/M, where N and M are integers. In this manner, a high precision frequency modulation can be applied to the clock signal 111.

In the clock signal generating circuit 100, the frequency modulation data FMDATA1 can be input to the adder 121 included in the divider 102 (for executing the spread spectrum modulation) separately from the reference division ratio M1, regardless of whether the reference division ratio M1 is a fixed value or the reference division ratio M1 varies depending on time. In other words, a frequency can be modulated only for a clock signal for which an EMI countermeasure may be required. Accordingly, redundant designing of unnecessary buffers can be avoided, and cost for designing the clock signal generating circuit can be reduced.

(Modified Example of the Clock Signal Generating Circuit)

Figure 6A:
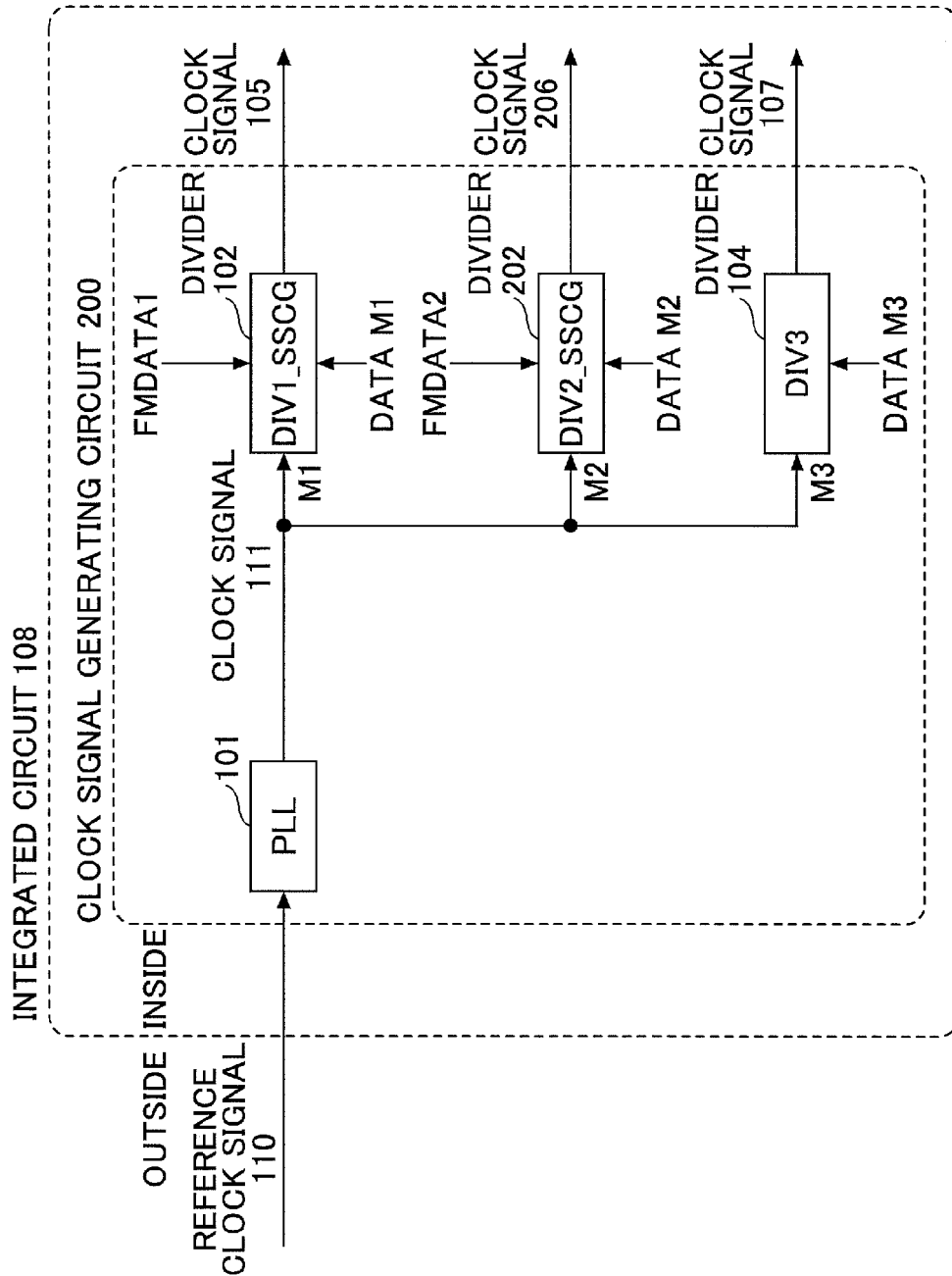
FIG. 6A is a diagram showing another example of the clock signal generating circuit.

FIG. 6A is a diagram showing a schematic configuration of an example of a clock signal generating circuit 200. The configuration of the clock signal generating circuit 200 may be substantially the same as that of the clock signal generating circuit 100, except for some points. In the following, the portions of the clock signal generating circuit 200 that are different from the configuration of the clock signal generating circuit 100 are mainly explained. The portions of the clock signal generating circuit 200 that are the same as those of the clock signal generating circuit 100 may be denoted by the corresponding identical reference numerals.

The clock signal generating circuit 200 includes the PLL 101; the divider 102 for executing the spread spectrum modulation; a divider 202 for executing the spread spectrum modulation; and the divider 104 for not executing the spread spectrum modulation.

Namely, the clock signal generating circuit 200 is a clock signal generating circuit such that, in the clock signal generating circuit 100, the divider 103 for not executing the spread spectrum modulation shown in FIG. 1 is replaced with the divider 202 for executing the spread spectrum modulation.

Reference division ratio data DATA M2 and frequency modulation data FMDATA2 are input to the divider 202 for executing the spread spectrum modulation. The divider 202 for executing the spread spectrum modulation divides the frequency 112 of the clock signal 111 by a division ratio M2' that is based on the reference division ratio data DATA M2 and the frequency modulation data FMDATA2, and the divider 202 outputs a clock signal 206.

The division ratio data DATA M2' varies in the vicinity of the reference division ratio data DATA M2 with respect to time. Accordingly, the division ratio M2' fluctuates with respect to time.

Figure 6B:
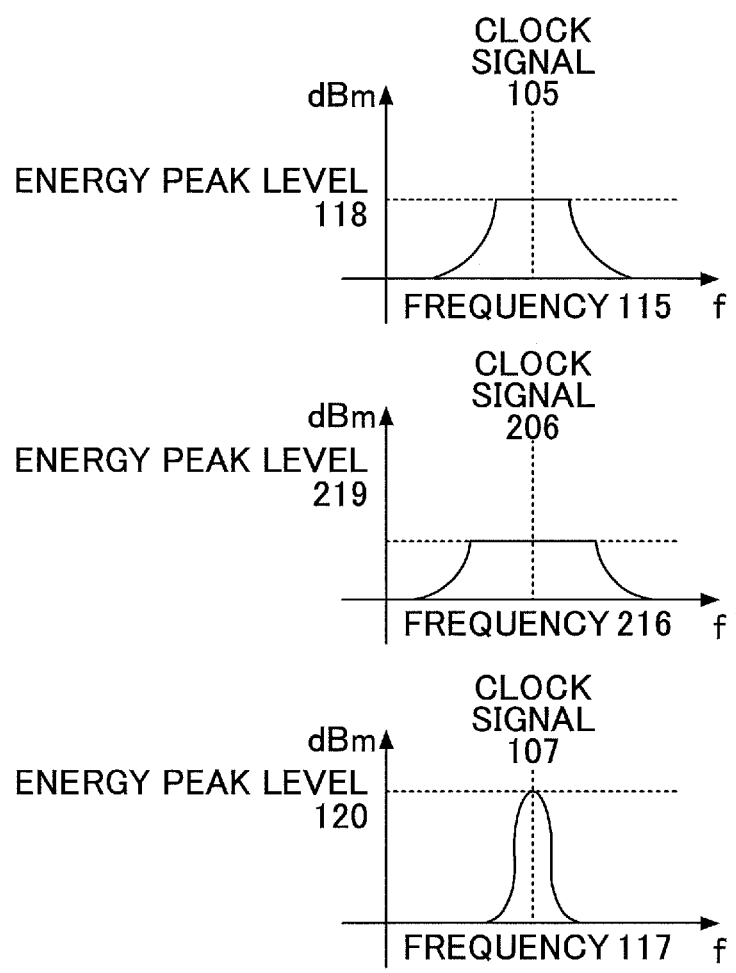
FIG. 6B is a diagram showing another example of relationship between a frequency and an energy peak level.

From FIG. 6B, it can be seen that an energy peak level 219 of the frequency modulated clock signal 206 is achieved for a frequency range having a certain width. The frequency of the clock signal 206 is modulated around a frequency 216 that is obtained by dividing the frequency 112 by the reference division ratio M2. The frequency of the clock signal 206 may be calculated by dividing the frequency 112 by the division ratio M2'.

A desirable frequency modulation can be applied to the clock signal 105 by suitably adjusting the frequency modulation data FMDATA1. A desirable frequency modulation can be applied to the clock signal 206 separately from the clock signal 105 by suitably adjusting the frequency modulation data FMDATA2 separately from the frequency modulation data FMDATA1. Accordingly, a minimum spread spectrum modulation can be applied to a clock signal for which an EMI countermeasure may be required. Consequently, generation of undesirable jitters (i.e., time-dependent variations of periods) can be prevented as much as possible.

In the clock signal generating circuit 200, by individually assigning frequency modulation data, a frequency modulation can be applied to a clock signal that may be used in an integrated circuit and for which an EMI countermeasure may be required. Accordingly, cost can be efficiently reduced for designing the clock signal generating circuit that can reduce effect of EMI.

APPLICATION EXAMPLE 1

Figure 7A:
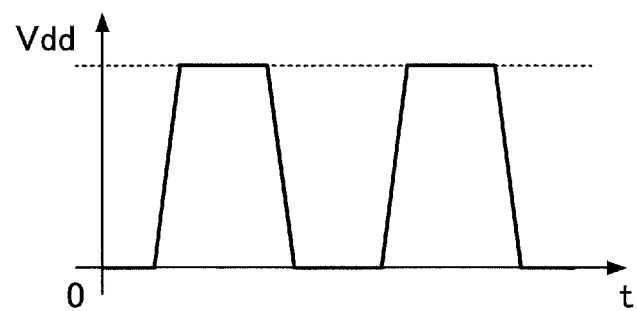
FIG. 7A is a diagram showing an example of a waveform of a spread spectrum clock signal.
Figure 7B:
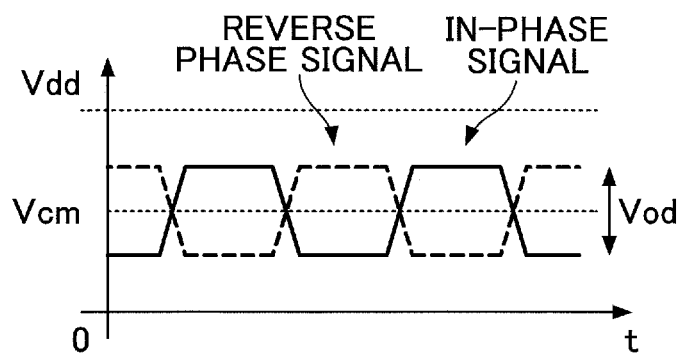
FIG. 7B is a diagram showing an example of a waveform of a spread spectrum clock signal that is used as a differential signal.

FIG. 7A is a diagram showing a waveform of a spread spectrum clock signal. FIG. 7B is a diagram showing an example of a waveform of a spread spectrum clock signal that is used as a differential signal.

The clock signal 105 output from the clock signal generating circuit 100 shown in FIG. 1 may be an example of the spread spectrum clock signal. Similarly, the clock signal 206 output from the clock signal generating circuit 200 shown in FIG. 6B may be an example of the spread spectrum clock signal.

As shown in FIG. 7A, the clock signal is a signal such that the voltage of the clock signal varies in a range from the ground potential (0) and the power supply potential (Vdd). As shown in FIG. 7B, the differential signal includes an in-phase signal and a reverse phase signal that vary around a common potential (Vcm).

In a generic electronic circuit, an amplitude of a clock signal may be least approximately 1V. A potential difference (Vod) between the in-phase signal and the reverse phase signal of the differential signal may be approximately several hundred mV. For example, for the LVDS standard, the potential difference (Vod) between the in-phase signal and the reverse phase signal may be approximately 350 mV.

Accordingly, in an electronic circuit, noise immunity of FIG. 7B may be better than that of FIG. 7A. Additionally, for the case of FIG. 7B, the amplitude of the signal is less than that of FIG. 7A. Accordingly, for the case of FIG. 7B, effect of EMI may be relatively easily reduced, compared to the case of FIG. 7A. Additionally, by using twisted pair cables, electromagnetic waves may cancel out each other, and the effect of EMI can be reduced.

Accordingly, when a differential signal is applied as a spread spectrum clock signal in the clock signal generating circuit according to the embodiment, effect of EMI may further be reduced. The cost for designing the clock signal generating circuit may further be reduced, because of this effect of reducing EMI.

APPLICATION EXAMPLE 2

(Configuration of an Image Forming Apparatus)

Figure 8A:
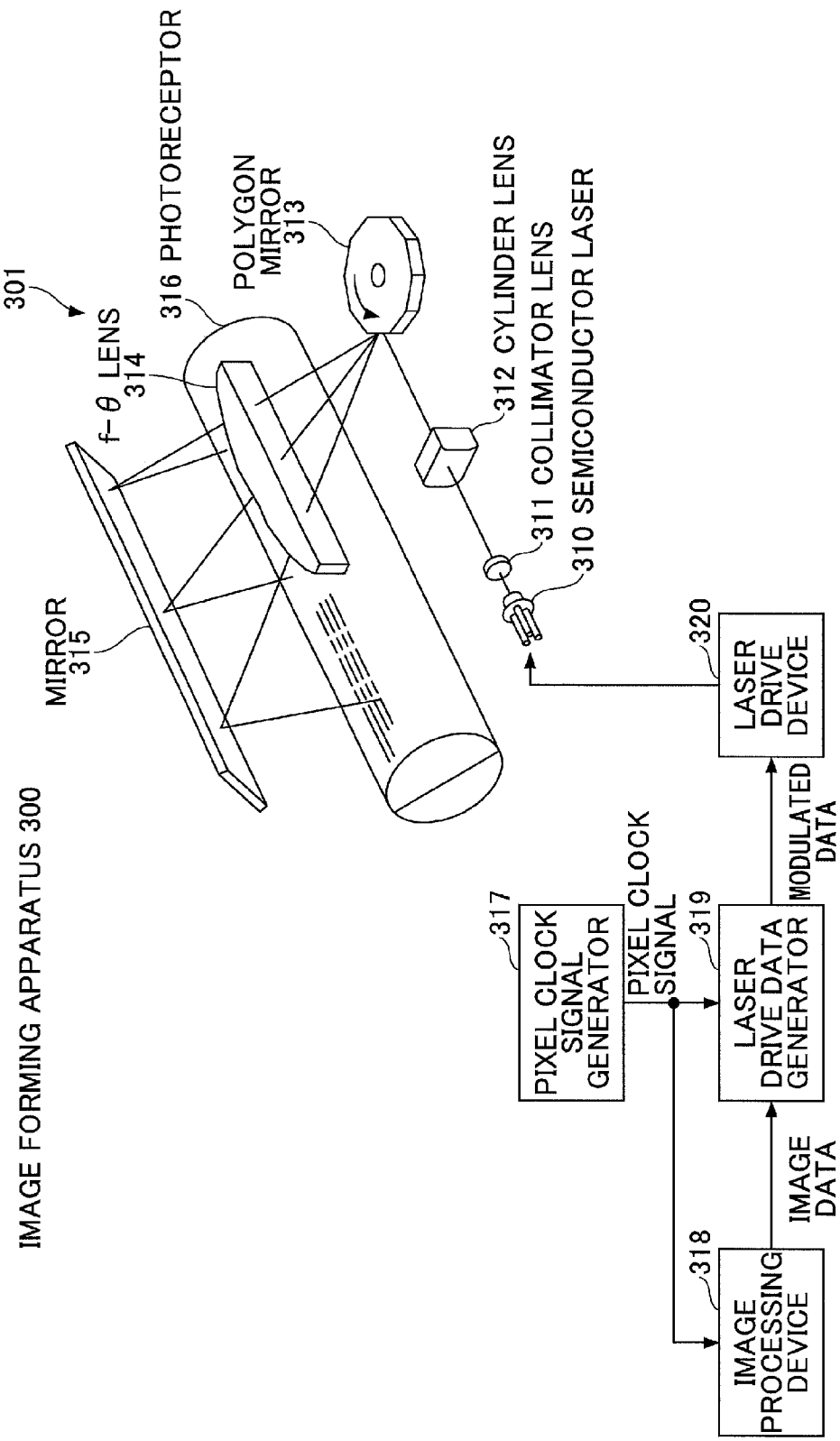

FIGS. 8A and 8B are diagrams showing a schematic configuration of an example of an image forming apparatus. The image forming apparatus includes an optical scanner according to the embodiment.

The image forming apparatus 300 shown in FIG. 8 may be an electrophotographic image forming apparatus. However, the type of the image forming apparatus 300 is not particularly limited.

The image forming apparatus 300 includes an optical scanner 301; a pixel clock signal generator 317; an image processing device (image processing circuit) 318; a laser drive data generator 319; and a laser drive device 320.

The optical scanner 301 includes a semiconductor laser 310; a collimator lens 311; a cylinder lens 312; a polygon mirror 313; an f-θ lens 314; a mirror 315; and a photoreceptor 316.

In addition to the above-described devices, the image forming apparatus 300 includes, for example, a charger for electrically charging a surface of the photoreceptor 316 (the surface to be scanned); a developing device for developing an electrostatic latent image into a toner image; a transfer device for transferring the developed toner image onto a paper sheet or onto an intermediate transfer body; and a cleaning unit for removing and collecting the residual toner on the photoreceptor 316. However, these are not shown in FIGS. 8A and 8B.

In the optical scanner 301, the semiconductor laser 310 emits a laser beam. The semiconductor laser 310 is a light source. The laser beam enters the polygon mirror 313 through the collimator lens 311 and through the cylinder lens 312. The polygon mirror 313 is an optical deflector.

The laser beam is deflected by the polygon mirror 313. The deflected laser beam passes through the f-θ lens 314, which is an optical guide unit. Then, the laser beam is reflected by the mirror 315.

When the laser beam that passes through the f-θ lens 314 enters the photoreceptor 316, which is a medium to be scanned, a laser beam spot is formed on the surface of the photoreceptor 316. In this manner, an image (electrostatic latent image) can be formed on the surface of the photoreceptor 316.

The pixel clock signal generator 317 can generate a pixel clock signal that defines a pixel (dot) period. The pixel clock signal generator 317 can input the pixel clock signal to the image processing device 318 and to the laser drive data generator 319.

The image processing device 318 generates image data. The image processing device 318 outputs the generated image data synchronously with the input pixel clock signal. The image data is input to the laser drive data generator 319.

The laser drive data generator 319 outputs laser drive data (e.g., pulse width modulated data) corresponding to the input image data, synchronously with the input pixel clock data. The laser drive data is input to the laser drive device 320.

The laser drive device 320 drives the semiconductor laser 310 in accordance with the laser drive data.

The clock signal generating circuit according to the embodiment may be applied to the pixel clock signal generator 317. The pixel clock signal generator 317 may utilize the clock signals output from the clock signal generating circuit 100 shown in FIG. 1 as the pixel clock signal, for example. Alternatively or additionally, the pixel clock signal generator 317 may utilize the clock signals output from the clock signal generating circuit 200 shown in FIG. 6 as the pixel clock signal, for example.

In the image forming apparatus 300 including the optical scanner 301 shown in FIG. 8A, rotational speed of the polygon mirror 313 may be almost constant. Accordingly, a deviation (a deviation of a main scanning magnification) may occur in a scanning width per pixel on the photoreceptor 316 within a fixed time period. The f-θ lens 314 may be utilized to correct the main scanning magnification. However, optical characteristics of the f-θ lens 314 may vary. Accordingly, further correction may be required.

Namely, the optical characteristics of the f-θ lens 314 may not always be ideal. When a variation exists in the optical characteristics of the f-θ lens 314, as shown in FIG. 8B, an actual pixel position B on the photoreceptor 316 that is irradiated by the scanning laser beam may not coincide with an ideal position A. The clock signal generating circuit according to the embodiment may be utilized to correct such a shift of the actual pixel position from the ideal pixel position that may be caused by the variation of the optical characteristic of the f-θ lens 314. The shift of the actual pixel position from the ideal pixel position can be corrected by modulating the period of the pixel clock signal by using the frequency modulation data in accordance with the above-described modulation method. By adjusting the period of the pixel clock signal, an irradiation position of the laser beam can be adjusted. In this manner, the actual pixel position can be corrected to a position that is closer to the ideal pixel position, and the main scanning magnification can be corrected. As described above, the clock signal generating circuit according to the embodiment can be applied to the pixel clock signal generator 317. In this case, the main scanning magnification can be corrected by adjusting the frequency modulation data (e.g., FMDATA1, and/or FMDATA2) that varies depending on time.

Figure 9:
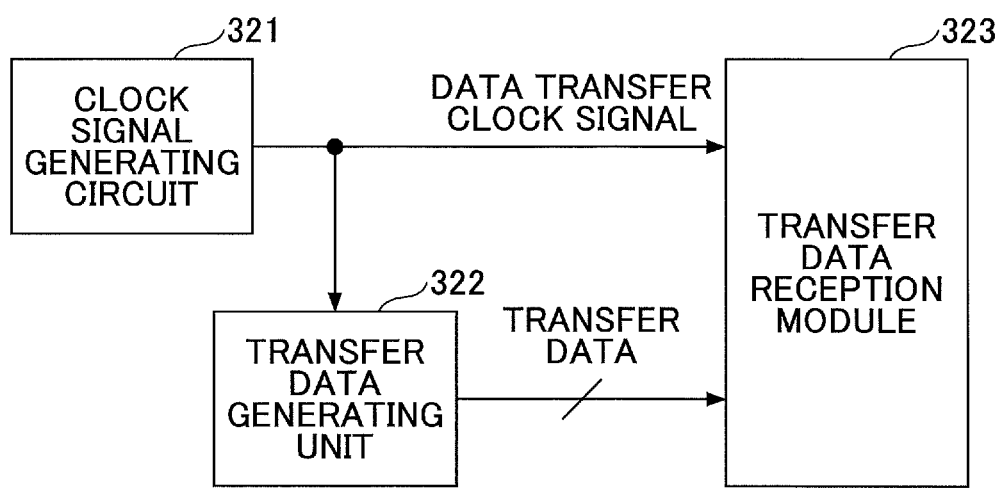
FIG. 9 is a diagram showing an example of use of the clock signal generating circuit.

The clock signal generating circuit according to the embodiment can be applied not only to the pixel clock generator 317 that generates the pixel clock signal, such as shown in FIG. 8, but also to a clock signal generating circuit 321 that generates a data transfer clock signal, such as shown in FIG. 9.

(Transmission of a Clock Signal)

FIG. 9 is a diagram illustrating an example in which a clock signal generating circuit for generating a data transfer clock signal is used for transmitting image data.

As shown in FIG. 9, the clock signal generating circuit 321 generates a data transfer clock signal. The clock signal generating circuit 321 inputs the data transfer clock signal to a transfer data generating unit 322 and to a transfer data reception module 323. In the clock signal generating circuit 321, a clock signal that is output from the clock signal generating circuit according to the embodiment can be used as the data transfer clock signal.

The transfer data generating unit 322 generates transfer data (image data). The transfer data generating unit 322 transmits the transfer data that is synchronized with the input data transfer clock signal to the transfer data reception module 323.

At this time, the data transfer clock signal may include a clock signal for which an EMI countermeasure may be required. In such a case, a frequency of the clock signal may be divided by the division ratio that is based on the division ratio data generated by the reference division ratio data and the frequency modulation data that varies with respect to time. In this manner, the frequency of the clock signal can be modulated, and the spread spectrum modulation can be applied to the clock signal. In other words, effect of EMI during transmission of the data transfer clock signal can be efficiently reduced.

By applying the clock signal generating circuit according to the embodiment to the clock signal generating circuit 321, the spread spectrum modulation can be efficiently applied to a clock signal for which an EMI countermeasure may be required. Accordingly, an increase in production requirements and complication of the circuit due to timing requirements may be avoided, and the cost for designing the clock signal generating circuit 321 may be reduced.

As described above, by applying the clock signal generating circuit according to the embodiment to the image forming apparatus 300 including the optical scanner 301, the pixel clock signal and/or the data transfer clock signal can be generated by the same clock signal generating circuit included in the image forming apparatus 300. Additionally, for the clock signal for driving the semiconductor laser 310 and the data transfer clock signal for transmitting the transfer data, the frequency modulation can be selectively applied.

In the above explanation, the example of the image forming apparatus 300 is explained that includes the optical scanner 301. However, the configuration of the image forming apparatus is not limited to this. The image forming apparatus 300 may be any type of image forming apparatus including the clock signal generating circuit according to the embodiment, such as a facsimile machine, a scanner, a printer, or a digital copier.

Hereinabove, the clock signal generating circuit, the image forming apparatus, and the clock signal generating method of the clock signal generating circuit are explained by the embodiment. However, the present invention is not limited to the above-described embodiment, and various modifications and improvements may be made within the scope of the present invention. Specific examples of numerical values are used in order to facilitate understanding of the invention. However, these numerical values are simply illustrative, and any other appropriate values may be used, except as indicated otherwise. A boundary of a functional unit or a processing unit in a functional block may not correspond to a boundary of a physical component. An operation by a plurality of functional units may be physically executed by a single component. Alternatively, an operation by a single functional unit may be physically executed by a plurality of components. For the convenience of explanation, the devices according to the embodiment of the present invention are explained by using the functional block diagrams. However, these devices may be implemented in hardware, software, or combinations thereof. The software may be prepared in any appropriate storage medium, such as a random access memory (RAM), a flash memory, a read-only memory (ROM), an EPROM, an EEPROM, a register, a hard disk drive (HDD), a removable disk, a CD-ROM, a database, a server, or the like.

The present application is based on and claims the benefit of priority of Japanese priority application No. 2013-041618 filed Mar. 4, 2013, the entire contents of which are hereby incorporated herein by reference.

What is claimed is:

1. A clock signal generating circuit configured to generate a clock signal, the clock signal generating circuit comprising:
   a clock signal generator configured to generate a reference clock signal; and
   a plurality of dividers to which the reference clock signal is to be input,
   wherein a division ratio of at least one of the plurality of dividers varies based on division ratio data that defines the division ratio of the at least one of the plurality of dividers,
   wherein the division ratio data represents a value that fluctuates around reference division ratio data with respect to time,
   wherein the division ratio data is formed of the reference division ratio data and frequency modulation data that varies with respect to time, and
   wherein an average value of the frequency modulation data with respect to time is zero.

2. The clock signal generating circuit according to claim 1, wherein the reference division ratio data is N/M, wherein N is a positive integer and M is a positive integer.

3. The clock signal generating circuit according to claim 1, wherein, for each of the plurality of dividers, frequency modulation data to be used is defined, and the frequency modulation data defined for each of the plurality of dividers depends on the divider that is to use the frequency modulation data.

4. An image forming apparatus comprising:
   a clock signal generating circuit configured to generate a clock signal, and
   an image processing circuit configured to operate by the clock signal generated by the clock signal generating circuit, wherein the clock signal generating circuit includes a clock signal generator configured to generate a reference clock signal; and a plurality of dividers to which the reference clock signal is to be input, wherein a division ratio of at least one of the plurality of dividers varies based on division ratio data that defines the division ratio of the at least one of the plurality of dividers, wherein the division ratio data represents a value that fluctuates around reference division ratio data with respect to time, wherein the division ratio data is formed of the reference division ratio data and frequency modulation data that varies with respect to time, and wherein an average value of the frequency modulation data with respect to time is zero.

5. A clock signal generating method of a clock signal generating circuit including a clock signal generator and a plurality of dividers, the clock signal generating method comprising:

a step of generating a reference clock signal;

a step of inputting the reference clock signal to the plurality of dividers;

a step of generating division ratio data that defines division ratios of the corresponding dividers; and a step of dividing the reference clock signal by each of the division ratios based on the division ratio data, wherein the division ratio data represents a value that fluctuates around reference division ratio data with respect to time, wherein the division ratio data is formed of the reference division ratio data and frequency modulation data that varies with respect to time, and wherein an average value of the frequency modulation data with respect to time is zero.

* * * * *